(12) United States Patent
Shibata et al.

(10) Patent No.: US 8,431,897 B2
(45) Date of Patent: Apr. 30, 2013

(54) TRANSMISSION ELECTRON MICROSCOPE

(75) Inventors: Naoya Shibata, Tokyo (JP); Wataru Inami, Tokyo (JP); Hidetaka Sawada, Tokyo (JP)

(73) Assignees: The University of Tokyo, Tokyo (JP); JEOL Ltd., Tokyo (JP)

( * ) Notice: Subject to any disclaimer, the term of this patent is extended or adjusted under 35 U.S.C. 154(b) by 112 days.

(21) Appl. No.: 13/013,919

(22) Filed: Jan. 26, 2011

(65) Prior Publication Data

US 2012/0187293 A1  Jul. 26, 2012

(51) Int. Cl.
*H01J 37/22* (2006.01)
*H01J 37/26* (2006.01)

(52) U.S. Cl.
USPC ............................................ 250/311; 250/306

(58) Field of Classification Search ........... 250/306–311
See application file for complete search history.

(56) References Cited

U.S. PATENT DOCUMENTS

| | | | | |
|---|---|---|---|---|
| 5,483,608 | A * | 1/1996 | Yokomachi et al. | 385/22 |
| 5,559,909 | A * | 9/1996 | Anderson et al. | 385/16 |
| 2002/0190219 | A1* | 12/2002 | Mooney | 250/397 |
| 2007/0194229 | A1* | 8/2007 | Okuda et al. | 250/310 |
| 2008/0191134 | A1* | 8/2008 | Almogy et al. | 250/307 |
| 2009/0261252 | A1* | 10/2009 | Hasegawa et al. | 250/311 |

FOREIGN PATENT DOCUMENTS

| | | |
|---|---|---|
| JP | 6399288 A | 4/1988 |
| JP | 6139442 A | 5/1994 |
| JP | 7281036 A | 10/1995 |
| JP | 8285947 A | 11/1996 |

* cited by examiner

*Primary Examiner* — Robert Kim
*Assistant Examiner* — David E Smith
(74) *Attorney, Agent, or Firm* — The Webb Law Firm

(57) ABSTRACT

A scanning transmission electron microscope using optical fibers as optical guiding media. The microscope obtains a high-angle scattering image or a dark-field image from electrons transmitted through a specimen. A scintillator converts electrons transmitted through the specimen into optical signals. The optical fibers couple outputs from the scintillator to the photodetector segments. The connections of the fibers with the photodetector segments are formed into arbitrary shapes.

4 Claims, 6 Drawing Sheets

TRANSMISSION ELECTRON MICROSCOPE

BACKGROUND OF THE INVENTION

1. Field of the Invention

The present invention relates to a transmission electron microscope and, more particularly, to a scanning transmission electron microscope using optical fibers grouped into fiber bundles so as to be adapted for optical detector segments of arbitrary shapes.

2. Description of Related Art

A transmission electron microscope (TEM) is an instrument permitting observation of a transmission electron microscope image (TEM image) or a diffraction image by irradiating a specimen with an electron beam emitted from an electron gun and forming such an image from electrons transmitted through the specimen.

Where a TEM image is obtained with a transmission electron microscope, a transmitted electron detector in an annular form is used. A scintillator is used to convert a transmitted electron image into an optical signal. An optical detector is used to convert the optical output from the scintillator into an electrical signal. Various kinds of optical transmission media are used from the scintillator to the optical detector.

FIG. 6 shows the configuration of a related art photoelectric converter. Transmitted electrons e impinging on one scintillator 1 are converted into an optical signal by the scintillator 1 and guided via a light guide 2 to a photomultiplier (PMT) 4 that is an optical detector. As an example, optical fibers are used as the light guide 2. Transmitted electrons e incident on another scintillator 1 are converted into a light signal by the scintillator 1 and guided to another photomultiplier (PMT) 4 via a light guide 3.

The configuration 1A, 2, 4A shown in FIG. 6 is known as a high-angle annular dark-field (HAADF) detector. The configuration 1B, 3, 4B shown in FIG. 6 is known as a bright-field (BF) detector. In actual instrumentation, the BF detector is disposed behind the HAADF detector. High-angle annular dark-field scanning transmission electron microscopy (HAADF-STEM) is one dark-field imaging method and is used to detect and image those transmitted electrons e which are scattered through large angles with an annular detector.

A known instrument of this kind is described, for example, in JP-A-8-285947 (paragraphs [0020-0028]; FIG. 6) and is an electron beam detection system for use with an electron microscope. The detection system is composed of a scintillator, a transparent substrate, optical lenses, an avalanche imaging device, an imaging device controller, a computer, and a monitor. The detection region of the sensitive surface of the imaging device is partially set by the imaging device controller.

Furthermore, a technique using a four-segmented radiation detector is known as described, for example, in JP-A-61-39442 (from page 2, right lower column, line 2 to page 3, right lower column, line 12; FIGS. 1 and 2). The radiation detector is matched to a scanning pattern. Individual signals are recorded for desired ones of the line segments of the scanning pattern. In addition, a structure having plural conductive beam-sensitive surfaces which are disposed in the path of a charged-particle beam and which are successively arranged radially and peripherally from the center is known (see, for example, JP-UM-A-63-99288).

Additionally, a medium which transmits an electron image to a detector within an electron microscope and which couples together the ends of a scintillator plate and bundles of optical fibers is known (see, for example, JP-A-7-281036 (paragraphs [0013-0018]; FIGS. 1-3)).

The related art scanning transmission electron detector has the problem that information about an angular distribution or directional distribution of scattered electrons cannot be precisely obtained because the scattered electrons are averaged with respect to angle or direction before being detected. In order to obtain angular information with conventional detectors, an HAADF detector and a BF detector which are different in annular size are used. In this case, the number of segments and their shapes are greatly limited. Furthermore, in the related art method using a light guide, it is impossible even to split a detector into four segments as shown in FIG. 7.

With the segmented TEM detector, it is necessary to control the positional relationship between a diffraction pattern and the detector segments. In the conventional method, the positional relationship must be controlled by the use of a magnetic lens or by rotating the detector itself. With these methods, it is quite difficult to accomplish a complete positional control. It is necessary to change the state from the state shown in FIG. 4A to the state shown in FIG. 4B. In the state FIG. 4A, there are shown a 4-segment detector 10 and a diffraction pattern 11. Under this condition, it is necessary to control the symmetry between the diffraction pattern and the detector as shown in FIG. 4B.

SUMMARY OF THE INVENTION

In view of the problem described so far, the present invention has been made. It is an object of the present invention to provide a scanning transmission electron microscope which permits one to define a region in which transmitted electrons are detected by the use of an optical guiding medium made of optical fibers and which can easily control the positional relationship between a diffraction pattern and a detector.

A first embodiment of the present invention provides a transmission electron microscope for obtaining a high-angle scattering image or a dark-field image from electrons transmitted through a specimen, the microscope having a scintillator for converting signals representing the electrons transmitted through the specimen into optical signals, a photodetector for detecting the optical signals emanating from the scintillator, and plural optical fibers for guiding optical outputs from the scintillator to segments of the photodetector. The optical fibers are grouped into plural fiber bundles which are connected with respective ones of the segments of the photodetector.

A second embodiment of the invention is based on the first embodiment and further characterized in that the optical fibers are divided into a first group of optical fibers whose respective first ends are connected with the scintillator and a second group of optical fibers whose respective first ends are connected with the photodetector. Second ends of the optical fibers of the first group are connected with second ends of the optical fibers of the second group at coupling positions. The optical fibers of the second group on a side of the photodetector can be rotated about the coupling positions.

A third embodiment of the invention is based on the second embodiment and further characterized in that coupling surfaces of the optical fibers of the second group on the side of the photodetector segments are divided into plural regions at the coupling positions and that the optical fibers are grouped into the fiber bundles according to the regions.

A fourth embodiment of the invention is based on the second embodiment and further characterized in that optical oil is injected at the coupling positions.

A fifth embodiment of the invention is based on any one of the first through fourth embodiments and further characterized in that the photodetector segments are photomultipliers or avalanche photodiodes.

According to the first embodiment of the invention, a region in which transmitted electrons are detected can be defined at will by using optical fibers as an optical guiding medium.

According to the second embodiment of the invention, the optical fibers on the photodetector side can be rotated at will and, therefore, the positional relationship between the diffraction pattern and the detector segments can be controlled easily.

According to the third embodiment of the invention, the optical fibers can be grouped into an arbitrary number of bundles of arbitrary shapes according to the detector segments.

According to the fourth embodiment of the invention, optical oil is injected at the coupling positions of the optical fibers, whereby loss of optical information from the coupling positions can be prevented.

According to the fifth embodiment of the invention, photomultipliers (PMTs) or avalanche photodiodes are used as the photodetector segments. Consequently, a high-speed, high-sensitivity operation necessary to obtain a transmitted electron image is enabled.

Other objects and features of the invention will appear in the course of the description thereof, which follows.

DESCRIPTION OF THE PREFERRED EMBODIMENTS

Figure 1:
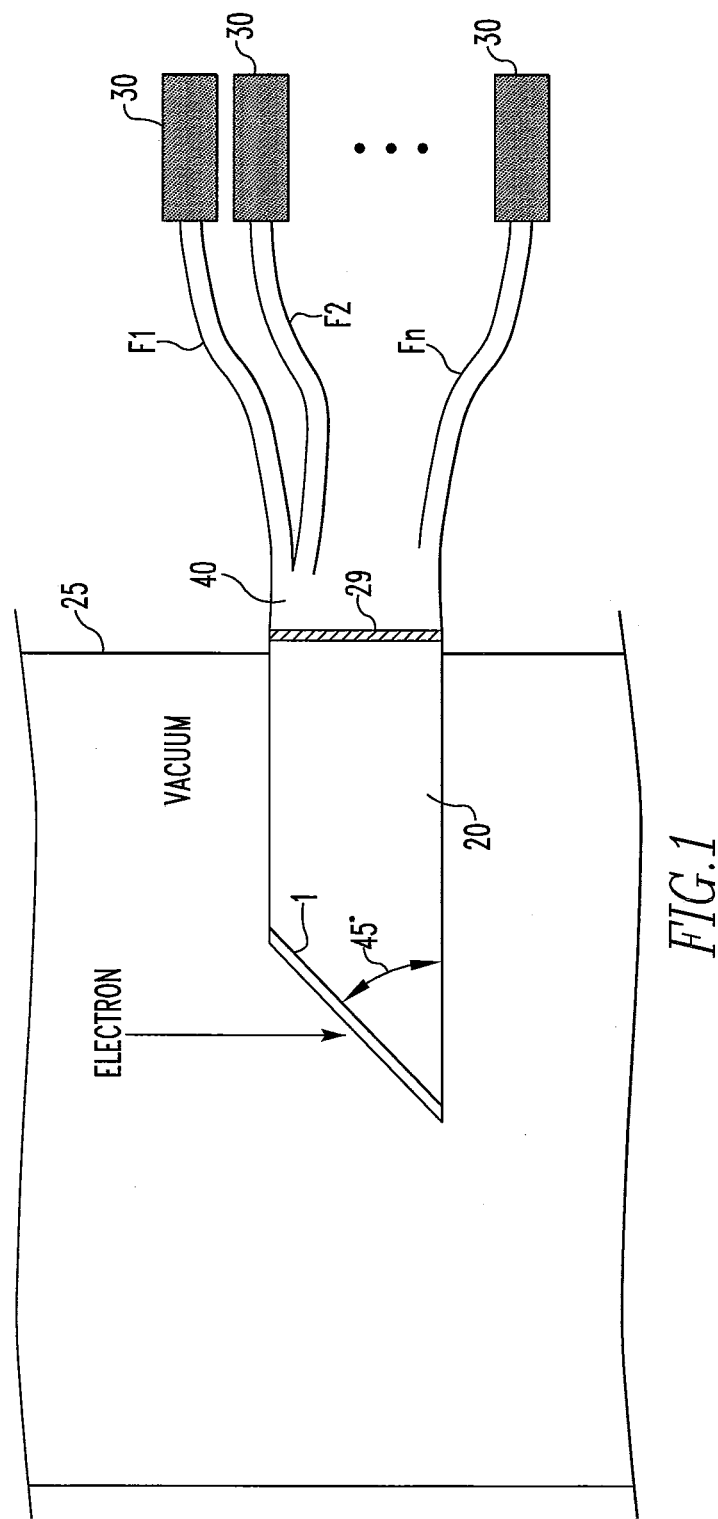
FIG. 1 is a schematic representation of a photodetector associated with the present invention.

The preferred embodiments of the present invention are hereinafter described in detail with reference to the drawings. FIG. 1 shows one example of configuration of a photodetector portion associated with the present invention, the photodetector portion being included in an electron microscope. The microscope has an electron optical column 25 whose interior is maintained as a vacuum. A YAP scintillator 1 receives transmitted electrons and converts them into a light signal. Plural optical fibers 20 are connected with the scintillator 1 such that the horizontal surface of the optical fibers make an angle, for example, of 45° to the scintillator 1.

The optical fibers 20 are cut at a desired position to obtain fiber segments 29 which are at a desired distance from the joint with the scintillator 1. The fiber segments 29 are injected with optical oil to prevent optical loss from the cut position.

End portions of the optical fibers 20 are organized into bundles F1-Fn of arbitrary shapes. Photomultipliers (PMTs) 30 acting as photodetector segments are connected with the fiber bundles F1-Fn, respectively.

In this embodiment, since the optical fibers are used as optical conducting media, a region in which transmitted electrons are detected can be defined at will. Furthermore, the joints of the optical fibers 20 with the scintillator 1 and with the photomultipliers 30 can be organized into an arbitrary number of fiber bundles of arbitrary shapes, according to the segmented regions of the detection surface. Additionally, in this embodiment, the optical fibers can be cut at a desired distance from the joints with the scintillator, and the fibers on the PMT side can be rotated at will. Consequently, it is easy to control the positional relationship between a diffraction pattern and the PMTs 30.

Further, according to this embodiment, the segments 29 of the optical fibers 20 are injected with optical oil. This fills in the gaps in the segments. The ends of the fibers 20 on the scintillator side and the ends of the fibers 40 on the detector side are coupled together via the optical oil. Hence, loss of optical information can be prevented. Additionally, according to this embodiment, photomultiplier tubes (PMTs) are used as an optical detector and so a high-speed, stable operation for obtaining a transmitted electron image is enabled.

Figure 2:
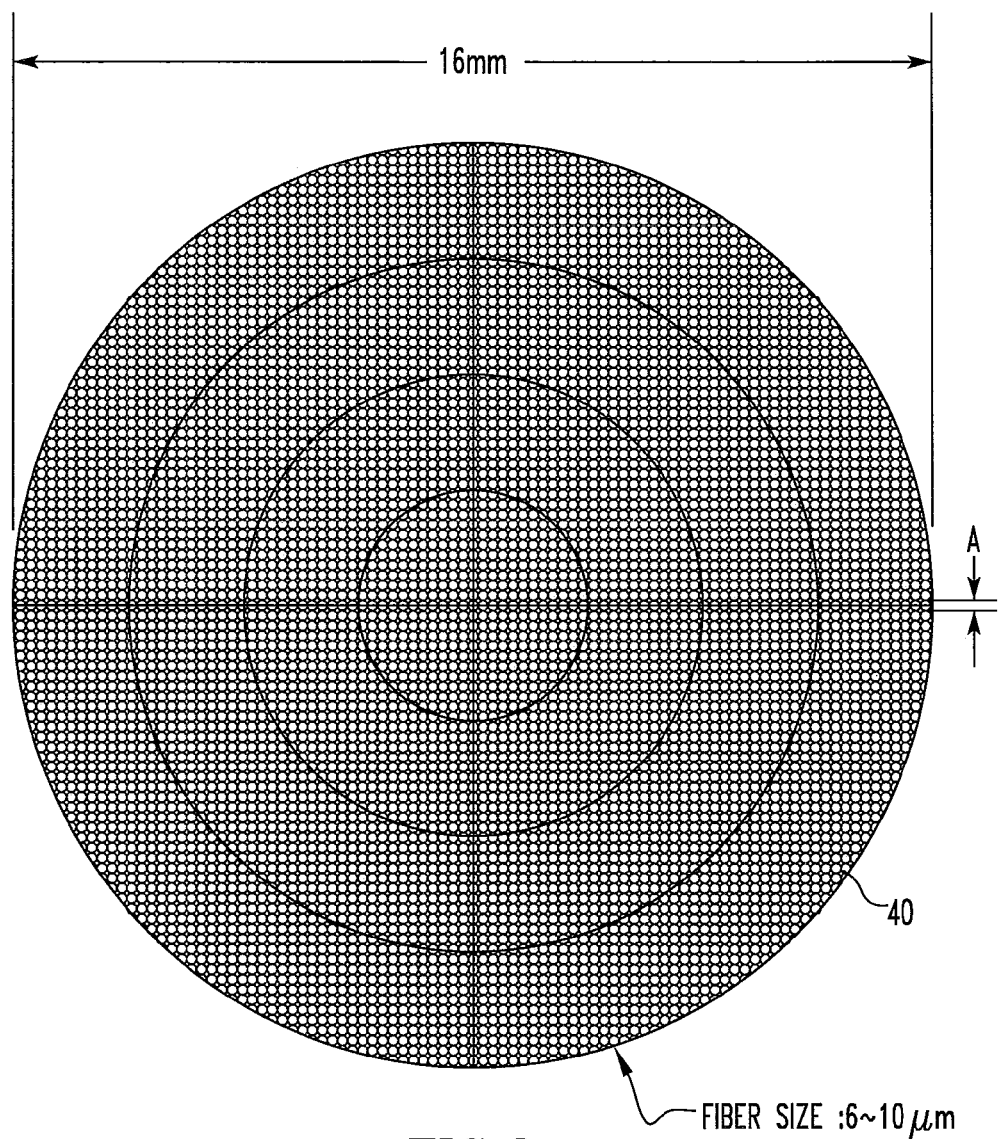
FIG. 2 is a horizontal cross section of bundles of optical fibers, showing their shapes.

FIG. 2 is a horizontal cross section of the optical fibers 40 on the detector side, showing how they are organized into the bundles. The shown surfaces of the optical fibers 40 on the detector side are coupling surfaces with the optical fibers 20 on the scintillator side. The optical oil is applied to the coupling surfaces. The shown optical fiber cable has a diameter of 16 mm. The individual fibers disposed in the cable have sizes of about 6 to 16 µm. The thick solid lines are division lines along which the optical fibers are grouped into the bundles. A gap A created across one of the division lines is about 150 µm at maximum. It can be seen from the figure that the optical fiber bundles of various shapes are formed.

Figure 3B:
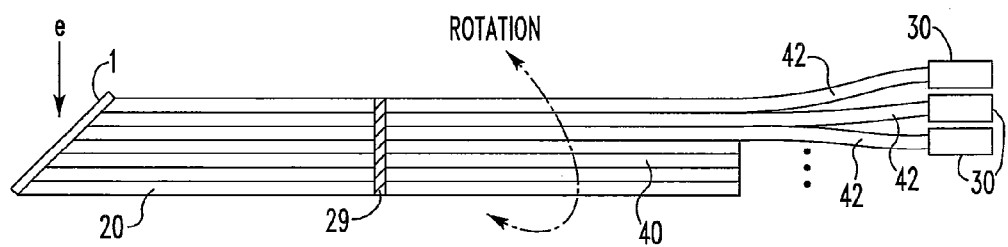
FIGS. 3A and 3B illustrate the manner in which optical fibers are rotated in accordance with the invention.
Figure 3A:
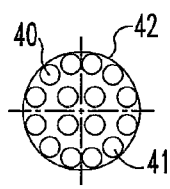

FIGS. 3A and 3B show the manner in which the optical fibers are rotated in accordance with the invention. FIG. 3A is a cross-sectional view of the fibers. Each fiber bundle 40 is formed by binding together plural optical fibers 41. In the illustrated case, the optical fibers 40 are divided into four bundles 42, which are connected with their respective photodetector segments 30. That is, there are as many photodetector segments 30 as there are fiber bundles 42.

FIG. 3B shows how the optical fibers are rotated. One end of each optical fiber 20 is coupled at a tilt angle of about 45° to the scintillator 1. The fibers 20 are cut at positions to produce fiber segments 29. The segments 29 are injected with optical oil to reduce optical loss before being coupled.

The optical fibers 40 on the opposite side of the segments of the optical fibers 20 are divided, for example, into 4 bundles as shown in FIG. 3A. The bundles 42 are connected with their respective photodetector segments 30. As a result, the photodetectors 30 convert the incident light fluxes from the fiber bundles into electrical signals that represent a transmitted electron image. The signals enter their respective signal-processing circuits, where given signal processing is performed. Then, an image of transmitted electrons or scattered electrons or a diffraction pattern is displayed on a display portion (not shown).

Figure 4A:
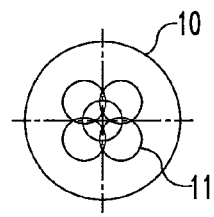
FIGS. 4A and 4B illustrate the manner in which the position of a diffraction pattern is varied when optical fibers are rotated.
Figure 4B:
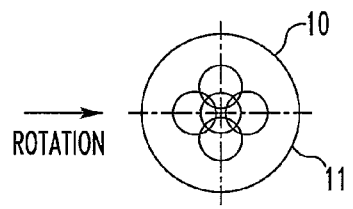

FIGS. 4A and 4B show the manner in which the position of a diffraction pattern varies with rotation of the optical fibers. In particular, by rotating the optical fibers 40 on the detector side (FIG. 3B), the state is changed from the state of FIG. 4A to the state of FIG. 4B. In FIG. 4A, there are shown a four-segment detector 10 and a diffraction pattern 11. When the optical fibers 40 are rotated, the state is changed from the state of FIG. 4A to the state of FIG. 4B, whereby the symmetry between the diffraction pattern 11 and the detector 10 is controlled.

Figure 5:
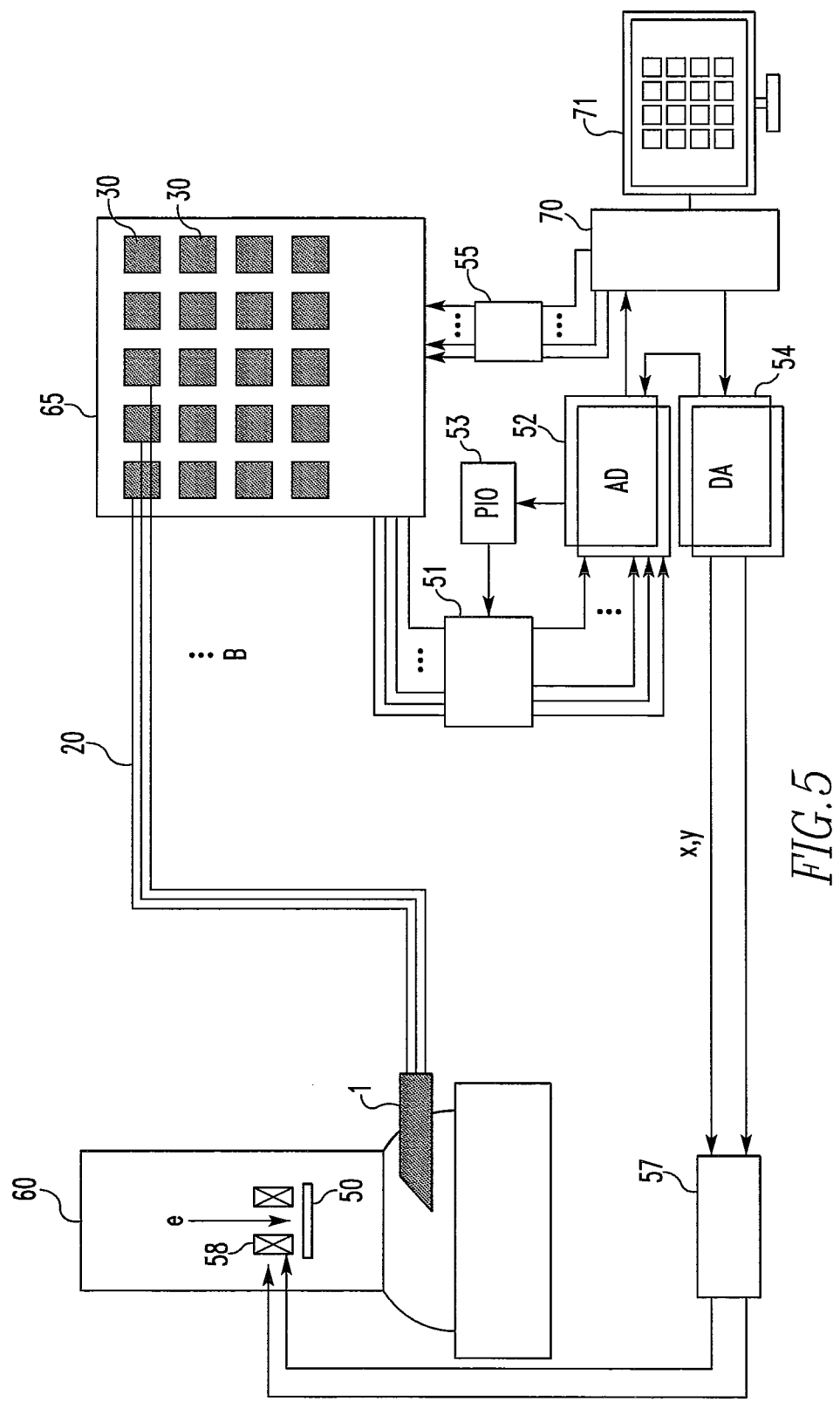
FIG. 5 is a schematic diagram of an electron microscope according to one embodiment of the present invention.
Figure 6:
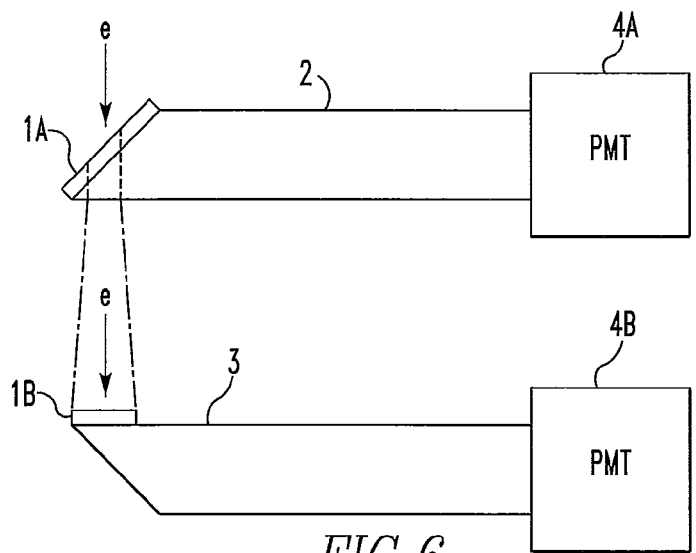
FIG. 6 is a schematic representation of a related art photoelectric converter.
Figure 7:
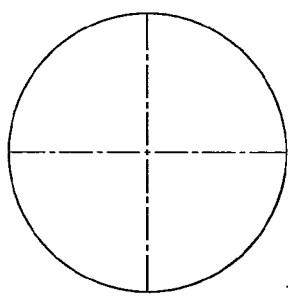
FIG. 7 illustrates the manner in which a detector is segmented.

FIG. 5 shows the structure of a scanning transmission electron microscope according to one embodiment of the present invention. The body of the microscope is indicated by 60. A specimen 50 is placed in the microscope body 60. The lenses of the illumination optical system and imaging optical system are omitted in the figure. When an electron beam e is made to impinge on the specimen 50, the beam is transmitted through the specimen 50. The transmitted electrons are made to impinge on the scintillator 1 as an image of transmitted or diffracted electrons or as a diffraction pattern.

The scintillator 1 outputs light signals corresponding to the amounts of incident electrons (i.e., the amounts of transmitted electrons). The optical fibers 20 transmit the light signals representing an image of transmitted electrons. A photodetector 65 consists of plural photomultipliers (PMTs) 30. The light signals which are sent in from the optical fibers 20 and which represent an image of transmitted or scattered electrons or a diffraction pattern enter the photodetector 65, i.e., are entered into their respective PMTs 30.

The PMTs 30 produce electrical signals corresponding to the input light signals. A low-pass filter 51 removes noise for each channel receiving an electrical signal from the corresponding PMT 30. There are as many channels as there are PMTs. An A/D converter 52 receives the outputs from the low-pass filter 51 and converts them into digital data for the individual channels corresponding to the PMTs. A frequency characteristic-changing circuit (PIO) 53 receives the outputs from the A/D converter 52 and varies the frequency characteristics of the low-pass filter. A D/A converter 54 receives a digital signal and converts it into a corresponding analog signal. A beam controller 57 receives the output from the D/A converter 54 and controls two-dimensional scanning of the electron beam over the specimen 50.

A personal computer 70 controls the whole operation of the microscope. A display portion 71 displays a transmitted electron image and other various kinds of information. For example, a CRT or liquid crystal display is used as the display portion 71. The output from the A/D converter 52 is entered into the personal computer 70, which in turn produces a control signal to the D/A converter 54. The D/A converter 54 produces a sync signal to the A/D converter 52. A contrast/brightness adjuster 55 controls the contrast and brightness for each PMT 30 in response to the output from the computer 70. The operation of the instrument constructed in this way is described below.

The beam controller 57 applies a two-dimensional scanning signal to a deflector 58 to scan the primary electron beam e in two dimensions. Consequently, electrons are transmitted through the specimen 50 and made to impinge on the scintillator 1, whereby the electrons are converted into light signals representing an image of transmitted or scattered electrons or a diffraction pattern. The light signals from the scintillator 1 are propagated through the optical fibers 20 and enter their respective PMTs 30 in the photodetector 65. The PMTs 30 convert the incident light signals into electrical signals.

The electrical signals from the PMTs 30 enter the low-pass filter 51, where noise is removed for each PMT 30. Each PMT is herein referred to as a channel. A transmitted electron image signal delivered from the low-pass filter 51 for each channel enters the A/D converter 52, where the analog signal is converted into digital data. The digital output from the A/D converter 52 is applied to the personal computer 70.

The personal computer 70 receiving the input signal representing image data processes the signal and displays the results on the display portion 71. As a consequence, an image of transmitted or scattered electrons or a diffraction pattern is presented on the display portion 71. The computer 70 sends a control signal to the D/A converter 54 at regular intervals. The D/A converter 54 sends a position control signal for the two-dimensional scanning to the beam controller 57. The D/A converter 54 sends a sync signal to the A/D converter 52. As a result, the A/D converter 52 performs an analog-to-digital conversion in synchronism with the output from the D/A converter 54.

The PIO 53 receiving the output from the A/D converter 52 outputs a control signal to vary the frequency characteristics of the low-pass filter 51, which in turn performs filtering most adapted for the outputs from the PMTs 30.

In the TEM body 60, the electrons e emitted from the electron gun (not shown) pass through the illumination optical system (not shown) and then are made to hit the sample 50. Electrons transmitted through the specimen 50 are made to impinge on the scintillator 1 through the imaging optical system. The scintillator 1 produces light rays responsive to the incident electrons representing the transmitted electrons. The output light rays from the scintillator 1 are passed to the photodetector 65 via the optical fibers 20.

The optical fibers 20 are cut at a desired position B and free to rotate with the photodetector 65. The ends of the fibers 20 are bundles respectively corresponding to the PMTs 30 in the photodetector 65 as shown. The fiber bundles are coupled to their respective PMTs 30, which in turn produce electrical signals corresponding to the incident electrons representing an image of transmitted electrons or other image. The contrast/brightness adjuster 55 adjusts the outputs from the PMTs 30 according to the control signal from the personal computer 70 and processes the output signals into signals representing optimum contrast and brightness. The output signals from the PMTs 30 which represent an image of transmitted or scattered electrons or a diffraction pattern are entered into the low-pass filter 51, where RF noise components are filtered out. The output signals from the filter 51 are furnished to the A/D converter 52.

In this embodiment, a region in which transmitted electrons are detected can be defined at will owing to the operations described so far and using optical fibers as optical guiding media. Furthermore, the joints of the optical fibers 20 with the scintillator 1 and with the PMTs 30 can be formed into any arbitrary number of fiber bundles having arbitrary shapes according to the segments of the detection surface. Furthermore, in this embodiment, the optical fibers are cut at a desired distance from the joints with the scintillator, and the fibers on the photodetector side can be rotated at will. Consequently, it is easy to control the positional relationship between the diffraction pattern and the PMTs 30.

In the above description, light rays from the optical fibers are detected by PMTs. Instead of PMTs, avalanche photodiodes may be used.

Figure 8A:
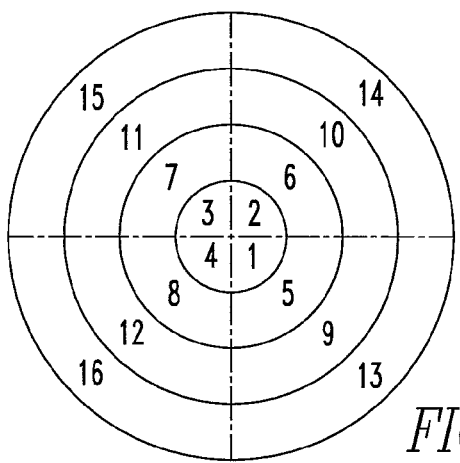
FIGS. 8A and 8B show STEM images obtained using a detector according to the invention.
Figure 8B:
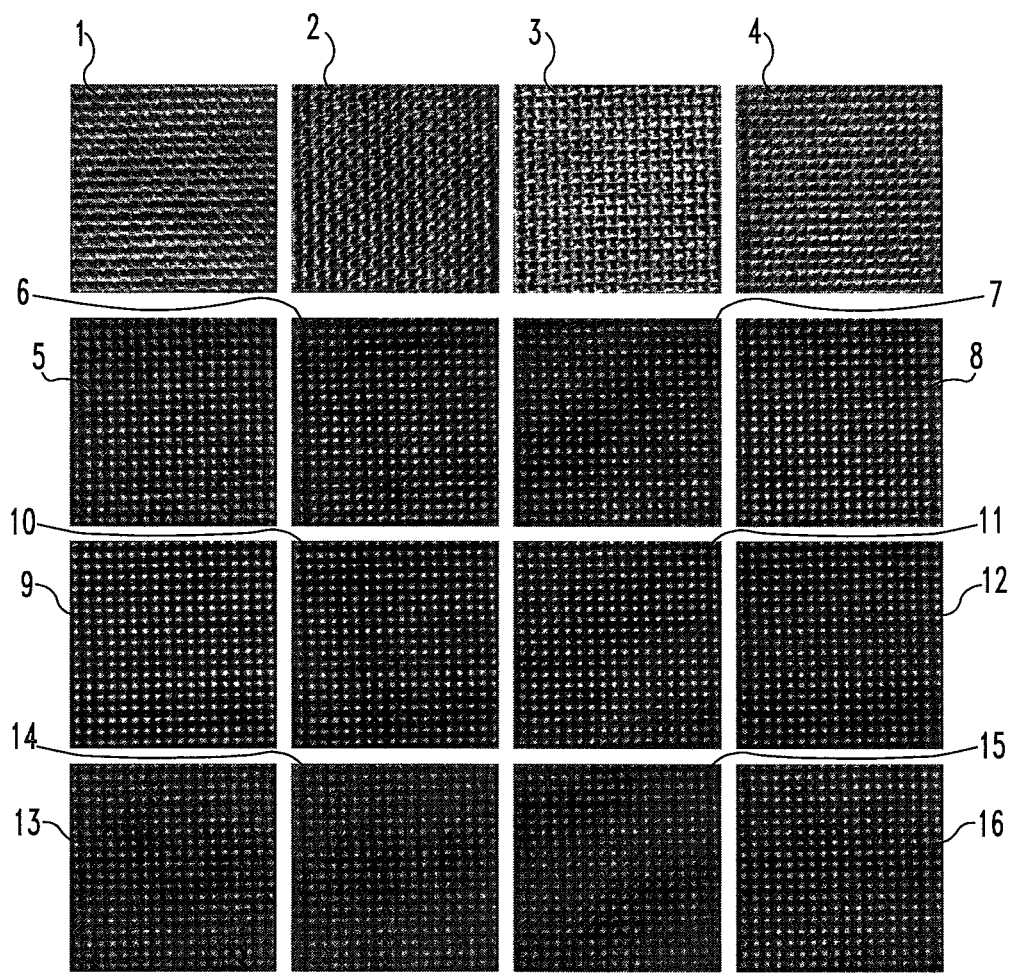

Images 1-16 in FIG. 8B are high-resolution (atomic-resolution) STEM (scanning transmission electron microscopy) images obtained from a specimen made of $SrTiO_3$. The STEM images 1-16 are scanning images which have been obtained by detecting electron intensities by means of scintillator segments corresponding to the detectors 1-16 of FIG. 8A (of the same structure as shown in FIG. 2) and converting the intensities into signals.

STEM images derived from their respective scintillator segments can be picked up at the same time by the use of the present detector in this way. In the experimental images presented here, the instrument is so set up that electrons passing inside the shadow of the condenser aperture are picked up by the scintillator segments 1-4 in such a way that an STEM image built up from the outputs from the detector segments 1-4 is a bright-field image. An STEM image built up from the detector segments 5-16 is a bright-field image. STEM image segments derived from their respective detector segments contain crystallographic or electron-optical information depending on the active detector segments. Using these images, much knowledge concerning material science can be obtained on an atomic scale.

The advantages of the present invention described thus far are enumerated below.

1) A detection region can be defined at will by using optical fiber bundles instead of light guides or hollow pipes.

2) A multi-channel detector that is obtained by angularly or directionally resolving the related art STEM detector can be fabricated by controlling the shape, size, and arrangement of optical fiber bundles.

3) By using fiber coupling (i.e., connection of a scintillator with PMTs by optical fibers) and the PMTs, signals can be detected with higher sensitivity than where CCDs are used as a photodetector. Consequently, ultrahigh-resolution imaging on an atomic level is enabled because PMTs respond at higher rates than CCDs and provide gains higher by 2 to 3 orders of magnitude.

4) Since information about positions at which an electron beam is scattered is obtained, signal detection techniques which have been heretofore difficult to implement such as quantitative evaluation of STEM images, compositional analysis of local dopants, measurement of atomic array distortions, analysis of distribution of nano-defect structures, and analysis of local phonons are enabled.

5) Because optical fibers are grouped into separate bundles and a rotating mechanism is introduced, it is easy to control the positional relationship between a diffraction pattern and detector segments.

6) With respect to crystals having various crystallographic orientations and anisotropies, imaging can be performed while accurately controlling the azimuthal relationship between each crystal structure and the detector.

Thus having thus described our invention with the detail and particularity required by the Patent Laws, what is desired protected by Letters Patent is set forth in the following claims.

The invention claimed is:

1. A transmission electron microscope for obtaining a high-angle scattering image or a dark-field image from electrons transmitted through a specimen, said transmission electron microscope comprising:
   a scintillator for converting signals representing the electrons transmitted through the specimen into optical signals;
   a photodetector for detecting the optical signals emanating from the scintillator; and
   plural optical fibers for guiding optical outputs from the scintillator to segments of the photodetector, the optical fibers being grouped into plural fiber bundles which are connected with respective ones of the segments of the photodetector,
   wherein said optical fibers are divided into a first group of optical fibers whose respective first ends are connected with said scintillator and a second group of optical fibers whose respective first ends are connected with said photodetector,
   wherein second ends of the optical fibers of the first group are connected with second ends of the optical fibers of the second group at coupling positions, and
   wherein the optical fibers of the second group on a side of the photodetector can be rotated about the coupling positions.

2. A transmission electron microscope as set forth in claim 1, wherein coupling surfaces of the optical fibers of the second group on the side of the photodetector are divided into plural regions at the coupling positions, and wherein said plural optical fibers are grouped into the fiber bundles according to the regions.

3. A transmission electron microscope as set forth in claim 1, wherein optical oil is injected at the coupling positions.

4. A transmission electron microscope as set forth in any one of claims 1, 2, and 3, wherein said photodetector comprises photomultipliers or avalanche photodiodes.

* * * * *